United States Patent
Nakamura (10) Patent No.: US 9,627,242 B2
(45) Date of Patent: Apr. 18, 2017

(54) WAFER PROCESSING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/727,214

(22) Filed: Jun. 1, 2015

(65) Prior Publication Data

US 2015/0357224 A1   Dec. 10, 2015

(30) Foreign Application Priority Data

Jun. 5, 2014   (JP) .................................. 2014-116412

(51) Int. Cl.
| | |
|---|---|
| H01L 21/00 | (2006.01) |
| H01L 21/683 | (2006.01) |
| H01L 21/02 | (2006.01) |
| H01L 21/82 | (2006.01) |
| H01L 21/67 | (2006.01) |
| H01L 21/78 | (2006.01) |
| H01L 21/304 | (2006.01) |

(52) U.S. Cl.
CPC .... *H01L 21/6836* (2013.01); *H01L 21/02076* (2013.01); *H01L 21/304* (2013.01); *H01L 21/67092* (2013.01); *H01L 21/67132* (2013.01); *H01L 21/78* (2013.01); *H01L 21/82* (2013.01); *H01L 2221/6834* (2013.01); *H01L 2221/68327* (2013.01)

(58) Field of Classification Search
CPC ............................................... H01L 21/67092
See application file for complete search history.

(56) References Cited

U.S. PATENT DOCUMENTS

| | | | |
|---|---|---|---|
| 7,211,168 B2 * | 5/2007 | Miyanari | ............ H01L 21/6708 |
| | | | 156/701 |
| 7,906,410 B2 * | 3/2011 | Arita | ........................ H01L 21/78 |
| | | | 438/460 |
| 2005/0203250 A1 * | 9/2005 | Miyakawa | ............ C09J 7/0246 |
| | | | 525/192 |

FOREIGN PATENT DOCUMENTS

| | | |
|---|---|---|
| JP | 2004-160493 | 6/2004 |
| JP | 2005-223282 | 8/2006 |
| JP | 2013-165229 | 8/2013 |

* cited by examiner

*Primary Examiner* — Zandra Smith
*Assistant Examiner* — Andre' C Stevenson
(74) *Attorney, Agent, or Firm* — Greer Burns & Crain Ltd.

(57) ABSTRACT

In a wafer processing method, a protective film is formed by applying a liquid resin to the front side of a wafer. A protective tape is adhered to a surface of the protective film. A modified layer is formed by applying a laser beam having such a wavelength as to be transmitted through the wafer along each of division lines, with a focal point positioned inside the wafer. The modified layer is formed inside the wafer along each of the division lines. The back side of the wafer is ground while supplying grinding water to thin the wafer to a predetermined thickness and to crack the wafer along the division lines using the modified layers as crack starting points so as to divide the wafer into individual device chips, after the protective film is formed, the protective tape is adhered, and the modified layer is formed.

3 Claims, 11 Drawing Sheets

WAFER PROCESSING METHOD

BACKGROUND OF THE INVENTION

Field of the Invention

The present invention relates to a wafer processing method by which a wafer having a plurality of division lines formed in a grid pattern on a front side thereof and having devices formed in a plurality of regions partitioned by the division lines is divided along the division lines.

Description of the Related Art

In a semiconductor device manufacturing process, a plurality of regions are partitioned by division lines arranged in a grid pattern on the front side of a semiconductor wafer having a substantially circular disk-like shape, and devices such as ICs and LSIs are formed in the thus partitioned regions. The thus formed semiconductor wafer is cut up along the division lines to divide the regions in which the devices are formed, thereby producing the individual device chips.

The cutting of the semiconductor wafer along the division lines as above is ordinarily conducted by use of a cutting apparatus called dicing saw. The cutting apparatus includes a chuck table for holding a workpiece such as a semiconductor wafer or an optical device wafer, cutting means for cutting the workpiece held on the chuck table, and feeding means for relatively moving the chuck table and the cutting means. The cutting means includes a spindle unit which includes a rotary spindle, a cutting blade mounted to the rotary spindle, and a driving mechanism for rotationally driving the rotary spindle. The cutting blade includes a circular disk-shaped base, and an annular cutting edge attached to a side surface peripheral portion of the base. The cutting edge is formed, for example, by fixing diamond abrasive grains with a grain diameter of about 3 μm to the base in a thickness of about 20 μm by electroforming.

Since the cutting blade has a thickness of about 20 μm, however, the division lines for partitioning the devices are required to have a width of about 50 μm, so that the ratio of the area of the division lines to the area of the wafer is high, which leads to a low productivity.

On the other hand, in recent years, as a method for dividing a wafer such as a semiconductor wafer, a laser processing method called internal processing has been put to practical use in which a pulsed laser beam having such a wavelength as to be transmitted through the wafer is applied to the wafer, with its focal point positioned in the inside of a region to be divided. The dividing method using the laser processing method called internal processing is a technology wherein the pulsed laser beam having such a wavelength as to be transmitted through the wafer is applied from one side of the wafer, with its focal point positioned in the inside of the wafer, so as to continuously form a modified layer in the inside of the wafer along each of division lines, and an external force is applied to the wafer along the division lines where wafer strength has been lowered due to the formation of the modified layers, thereby cracking and dividing the wafer along the division lines (see, for example, Japanese Patent Laid-Open No. 2004-160493).

As a method for dividing a wafer into individual devices by applying an external force to the wafer along the division lines of the wafer formed with the modified layers along the division lines in the aforementioned manner, a technology has been disclosed in Japanese Patent Laid-Open No. 2005-223282. In this technology, the wafer formed with the modified layers along the division lines is adhered to a dicing tape attached to an annular frame, and the dicing tape is expanded to apply a tension to the wafer, thereby dividing the wafer along the division lines where wafer strength has been lowered due to the formation of the modified layers, into the individual device chips.

In addition, Japanese Patent Laid-Open No. 2013-165229 discloses a technology wherein a protective tape is adhered to the front side of a wafer formed continuously with a modified layer along each of division lines, the protective tape side of the wafer is held onto a chuck table, thereafter the back side of the wafer is ground while supplying grinding water to thin the wafer to a predetermined thickness and divide the wafer into the individual device chips.

SUMMARY OF THE INVENTION

However, when the protective tape is adhered to the front side of the wafer formed continuously with the modified layers along the division lines and, in the condition where the protective tape side of the wafer is held onto a chuck table, the back side of the wafer is ground while supplying the grinding water to thin the wafer to a predetermined thickness and divide the wafer into the individual device chips, there arises a problem that the grinding water penetrates through the gaps between the individually split device chips to contaminate the side surfaces and the front surface of each device chip, thereby lowering the quality of the device chips.

Besides, when the adhesive film is attached to the back side of a wafer divided into individual device chips, with the dicing tape adhered thereto, and the dicing tape is expanded to break the adhesive film along each of the device chips, there arises a problem that since the adhesive film is formed to be slightly greater than the wafer, a peripheral portion of the adhesive film is fragmented and scattered, to adhere to the front surfaces of the device chips, thereby lowering the quality of the device chips.

Accordingly, it is an object of the present invention to provide a wafer processing method which can be carried out without contaminating the side surfaces and the front surface of each of device chips in a process wherein, in a condition where a protective tape is adhered to the front side of a wafer formed with a modified layer along each of division lines and the protective tape side of the wafer is held onto a chuck table, the back side of the wafer is ground while supplying grinding water so as to thin the wafer to a predetermined thickness and divide the wafer into individual device chips.

In accordance with an aspect of the present invention, there is provided a wafer processing method for dividing a wafer having a plurality of division lines in a grid pattern on a front side thereof and having a device in each of a plurality of regions partitioned by the division lines, along the division lines into individual device chips. The wafer processing method includes: a protective film forming step of applying a liquid resin to the front side of the wafer to form a protective film; a protective tape adhering step of adhering a protective tape to a surface of the protective film; a modified layer forming step of applying a laser beam having such a wavelength as to be transmitted through the wafer to the wafer along each of the division lines, with a focal point positioned inside the wafer, to form a modified layer inside the wafer along each of the division lines; and a back side grinding step of grinding a back side of the wafer while supplying grinding water to thin the wafer to a predetermined thickness and to crack the wafer along the division lines using the modified layers as crack starting points so as to divide the wafer into individual device chips, after the protective film forming step, the protective tape adhering step, and the modified layer forming step are carried out.

Preferably, an adhesive film breaking step of attaching an adhesive film to the back side of the wafer divided into the individual devices, adhering a dicing tape thereto, peeling the protective tape, and expanding the dicing tape so as to break the adhesive film along the individual devices, and a protective film removing step of supplying a cleaning liquid to the front side of the individual devices after the adhesive film breaking step so as to remove the protective film, are carried out after the back side grinding step is performed.

The wafer processing method of the present invention includes: a modified layer forming step of applying a laser beam having such a wavelength as to be transmitted through a wafer to the wafer along division lines, with a focal point positioned in the inside of the wafer, so as to form a modified layer in the inside of the wafer along each of the division lines; and a back side grinding step of grinding the back side of the wafer after the modified layer forming step while supplying grinding water so as to thin the wafer to a predetermined thickness and break the wafer along the division lines using the modified layers as crack starting points, thereby dividing the wafer into the individual device chips. Before the back side grinding step is performed, a protective film forming step of applying a liquid resin to the front side of the wafer to form a protective film and a protective tape adhering step of adhering a protective tape to the surface of the protective film are carried out. Although the grinding water with debris (grindings) mixed therein penetrates through the gaps between the individually split device chips during the back side grinding step, the grinding water with the debris (grindings) mixed therein would not reach the front surfaces of the devices, since the protective film has been formed on the front side of the wafer. Therefore, the problem that the grinding water with the debris (grindings) mixed therein contaminates the devices to lower the device quality can be avoided. Note that even when the wafer is divided into the individual device chips during the grinding, the protective film present as a comparatively firm coating on the front side of the wafer restrains the gaps between the device chips from widening, so that penetration of the grinding water through the gaps is inhibited, and side surface contamination of the device chips can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
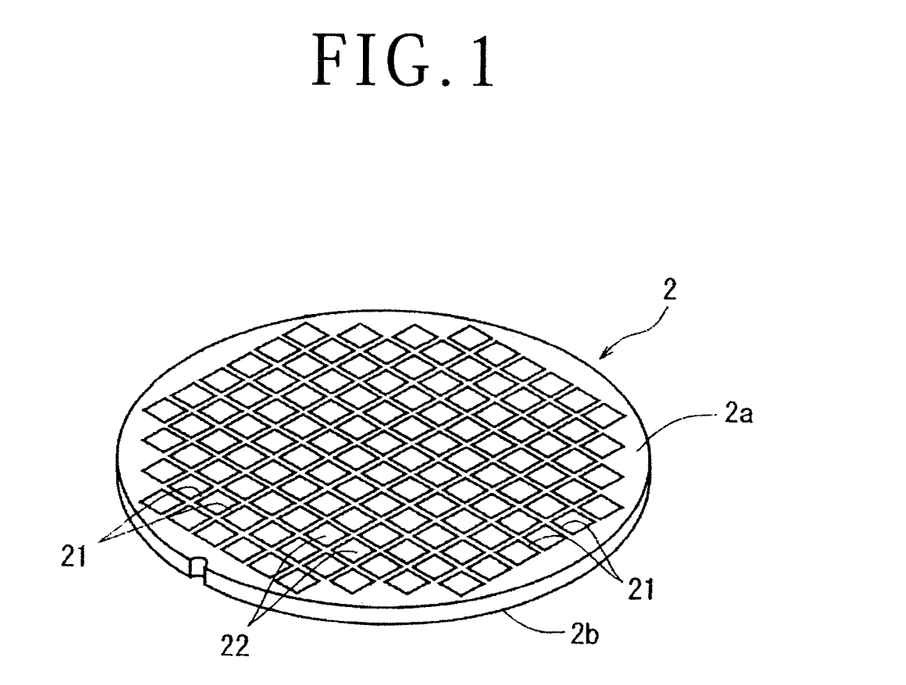
FIG. 1 is a perspective view of a semiconductor wafer.

Some preferred embodiments of a wafer processing method and a dividing apparatus according to the present invention will be described in detail below, referring to the attached drawings. FIG. 1 shows a perspective view of a semiconductor wafer 2 to be processed according to the present invention. The semiconductor wafer 2 depicted in FIG. 1 is composed of a silicon wafer having a thickness of, for example, 500 μm. On a front side 2a of the semiconductor wafer 2, a plurality of division lines 21 are formed in a grid pattern, and a device 22 such as an IC and an LSI is formed in each of a plurality of regions partitioned by the division lines 21. A description will now be made of a wafer processing method for dividing the semiconductor wafer (hereinafter also referred to simply as "wafer" for short) 2 along the division lines 21 into the individual devices (device chips) 22.

Figure 2A:
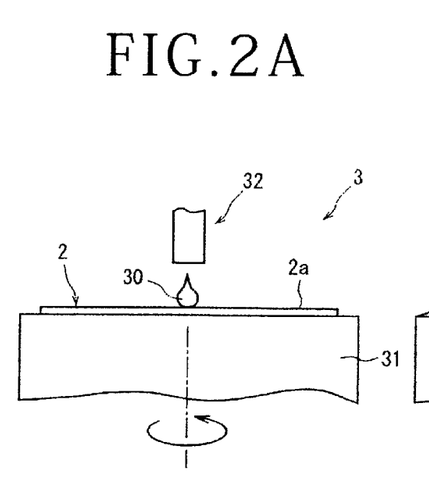
FIGS. 2A to 2C are explanatory views illustrating a protective film forming step.
Figure 2B:
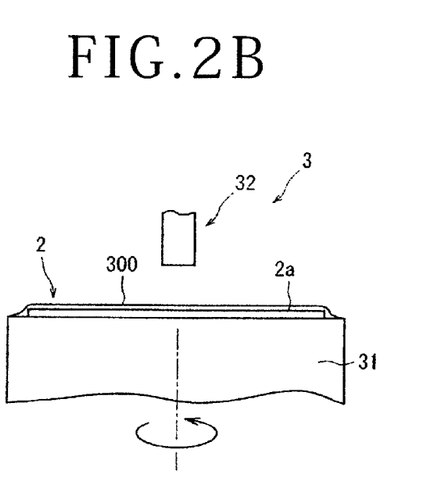
Figure 2C:
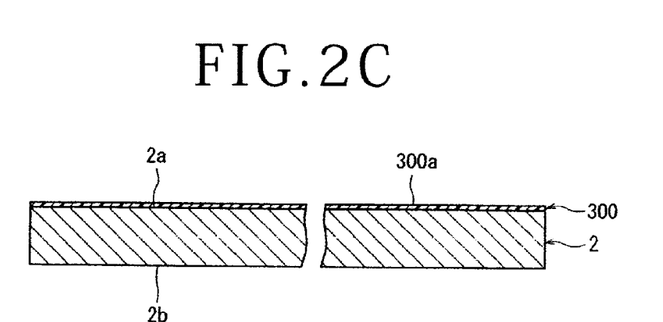

First, a protective film forming step is performed in which a liquid resin is applied to the front side 2a of the semiconductor wafer 2 to form a protective film. The protective film forming step is carried out by use of a protective film forming apparatus 3 illustrated in FIGS. 2A and 2B. The protective film forming apparatus 3 shown in FIGS. 2A and 2B includes a spinner table 31 for holding the wafer, and a liquid resin supply nozzle 32 disposed over a rotational center of the spinner table 31. On the spinner table 31 of the protective film forming apparatus 3 configured in this way, the semiconductor wafer 2 is placed with its back side 2b in contact with the spinner table 31. Then, suction means (not shown) is operated to hold the semiconductor wafer 2 onto the spinner table 31 by suction. Therefore, the semiconductor wafer 2 held on the spinner table 31 has its front side 2a on the upper side. With the semiconductor wafer 2 held on the spinner table 31 in this manner, the spinner table 31 is kept rotated at a predetermined rotational speed (for example, 300 rpm to 1,000 rpm) in the direction of arrow as shown in FIG. 2B, and a predetermined amount of a liquid resin 30 is dropped to a central region of the front side 2a of the semiconductor wafer 2 from the liquid resin supply nozzle 32 disposed over the spinner table 31. The spinner table 31 is rotated for about 60 seconds under this condition, whereby a protective film 300 is formed on the front side 2a of the semiconductor wafer 2 as shown in FIG. 2C. The thickness of the protective film 300 as a coating on the front side 2a of the semiconductor wafer 2, which is determined by the amount of the liquid resin 30 dropped, may be about 50 μm. Note that it is desirable to use as the liquid resin 30 a water-soluble resin such as polyvinyl alcohol (PVA), water-soluble phenolic resins, and acrylic water-soluble resins.

Figure 3A:
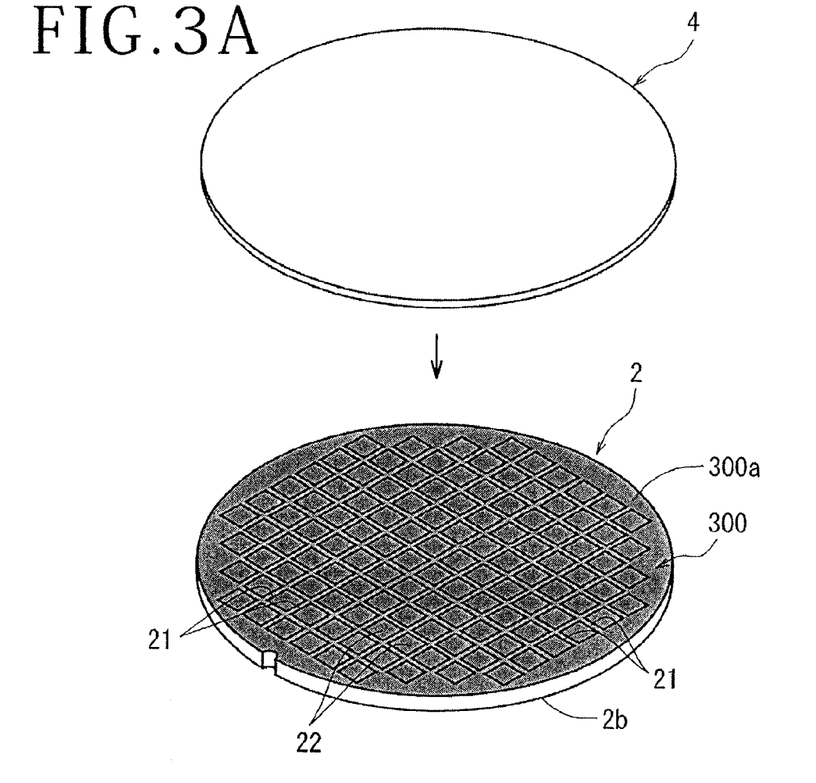
FIGS. 3A and 3B are explanatory views illustrating a protective tape adhering step.
Figure 3B:
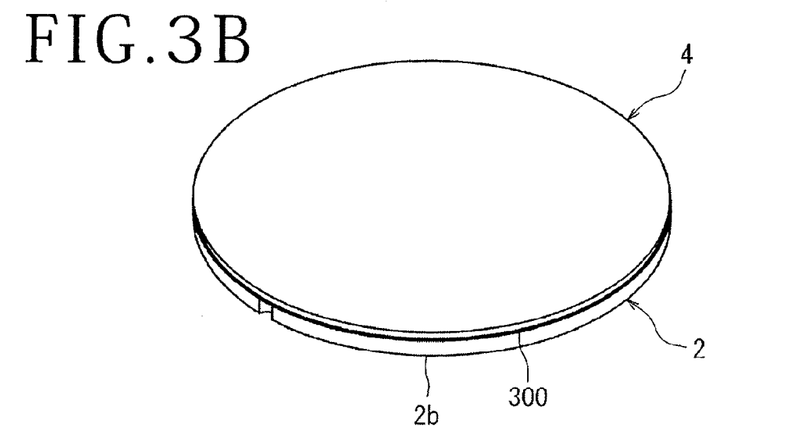

After the protective film 300 formed as a coating on the front side 2a of the semiconductor wafer 2 by carrying out the aforementioned protective film forming step is dried and solidified, a protective tape adhering step is conducted in which a protective tape is adhered to a surface 300a of the protective film 300. Specifically, as illustrated in FIGS. 3A and 3B, a protective tape 4 is adhered to the surface 300a of the protective film 300 formed as a coating on the front side 2a of the semiconductor wafer 2. Note that the protective tape 4 in this embodiment includes a 100 μm-thick sheet-shaped base material formed of polyvinyl chloride (PVC) and an acrylic resin paste applied to the surface of the base material in a thickness of about 5 μm. Incidentally, it is sufficient for the protective film forming step and the protective tape adhering step as above to be carried out before a back side grinding step (described later) is performed.

Next, a modified layer forming step is conducted in which a laser beam having such a wavelength as to be transmitted through the semiconductor wafer 2 is applied to the semiconductor wafer 2 along each of the division lines 21, with a focal point positioned inside the semiconductor wafer 2, to form a modified layer along each of the division lines 21. The modified layer forming step is carried out by use of a laser processing apparatus 5 depicted in FIG. 4. The laser processing apparatus 5 illustrated in FIG. 4 includes a chuck table 5 for holding a workpiece, laser beam applying means 52 for applying a laser beam to the workpiece held on the chuck table 51, and imaging means 53 for imaging the workpiece held on the chuck table 51. The chuck table 51 is so configured as to hold the workpiece by suction, and is moved by a moving mechanism (not shown) in a feeding direction indicated by arrow X and an indexing direction indicated by arrow Y in FIG. 4.

Figure 4:
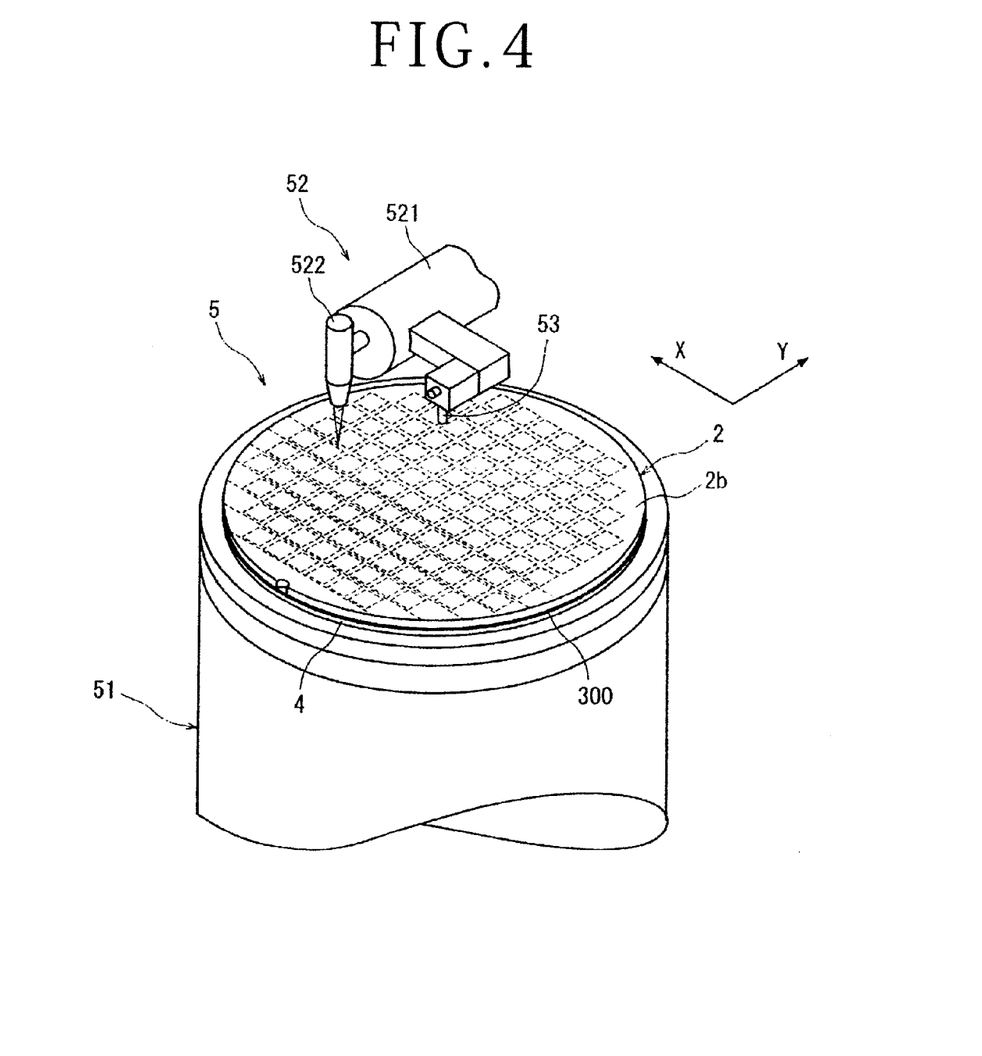
FIG. 4 is a major part perspective view of a laser processing apparatus for carrying out a modified layer forming step.

The laser beam applying means 52 radiates a pulsed laser beam through a focusing device 522 mounted to a tip of a cylindrical casing 521 disposed substantially horizontally. In addition, the imaging means 53 mounted to a tip portion of the casing 521 constituting the laser beam applying means 52, in this embodiment, includes not only an ordinary imaging element (CCD) for imaging by use of visible rays but also infrared illuminating means for irradiating the workpiece with infrared rays, an optical system for capturing the infrared rays radiated by the infrared illuminating means, an imaging element (infrared CCD) for outputting an electrical signal corresponding to the infrared rays captured by the optical system, and so on, and sends an image signal based on the imaging to control means (not shown).

A modified layer forming step performed by use of the aforementioned laser processing apparatus 5 will be described, referring to FIGS. 4, 5A, and 5B. In this modified layer forming step, first, the semiconductor wafer 2 having been subjected to the protective tape adhering step is placed on the chuck table 51 of the aforementioned laser processing apparatus 5 shown in FIG. 4, with the protective tape 4 in contact with the chuck table 51. Then, suction means (not shown) is operated to hold the semiconductor wafer 2 onto the chuck table 51 through the protective tape 4 by suction (wafer holding step). Therefore, the semiconductor wafer 2 held on the chuck table 51 has its back side 2b on the upper side. The chuck table 51 with the semiconductor wafer 2 suction held thereon in this way is positioned into a position directly under the imaging means 53 by feeding means (not shown).

After the chuck table 51 is positioned directly under the imaging means 53, an alignment operation for detecting a work region to be laser-processed of the semiconductor wafer 2 by the imaging means 5 and the control means (not shown) is carried out. Specifically, the imaging means 53 and the control means (not shown) performs alignment of a laser beam application position by executing an image processing such as pattern matching for positional matching between the division line 21 formed in a first direction on the semiconductor wafer 2 and the focusing device 522 of the laser beam applying means 52 for applying a laser beam along the division line 21. In addition, the alignment of the laser beam application position is conducted also for the division line 21 formed on the semiconductor wafer 2 to extend in a second direction orthogonal to the first direction. In this instance, although the front side 2a of the semiconductor wafer 2 on which the division lines 21 are formed is located on the lower side, the division lines 21 can be imaged on the back side 2b in a see-through manner, since the imaging means 53 includes the infrared illuminating means, and imaging means constituting the optical system for capturing infrared rays, the imaging element (infrared CCD) for outputting an electrical signal corresponding to the infrared rays, and so on.

Figure 5A:
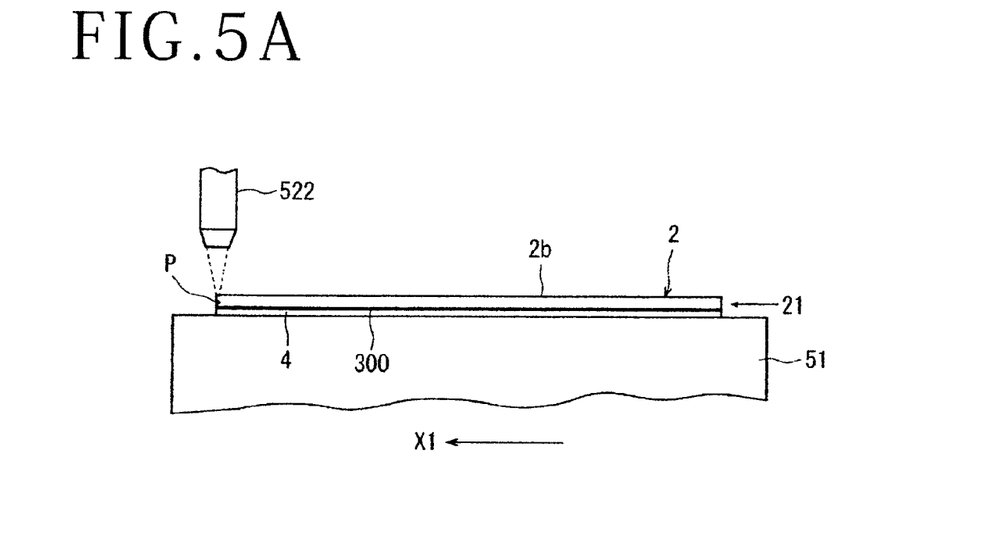
FIGS. 5A and 5B are explanatory views illustrating the modified layer forming step.
Figure 5B:
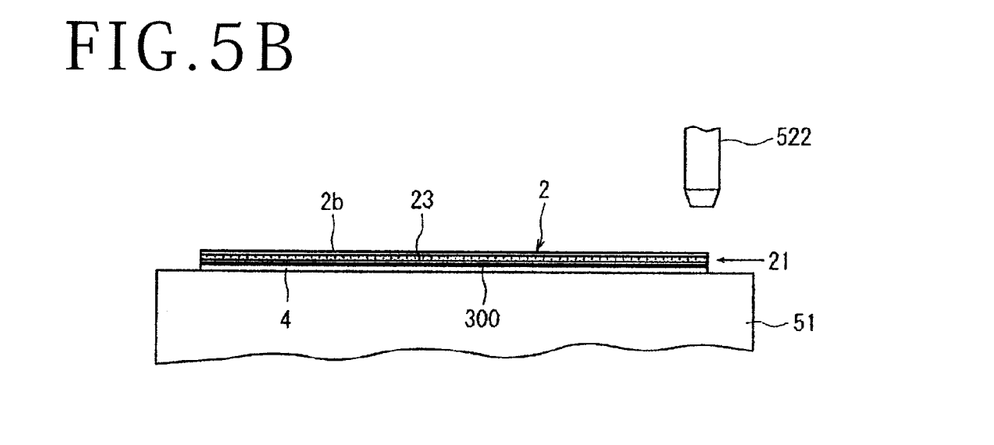

After the division line 21 formed on the semiconductor wafer 2 held on the chuck table 51 is detected and the alignment of the laser beam application position is conducted in the above-mentioned manner, as shown in FIG. 5A, the chuck table 51 is moved into a laser beam application region in which the focusing device 522 of the laser beam applying means 52 for radiating the laser beam is located, and one end (the left end in FIG. 5A) of a predetermined division line 21 is positioned directly under the focusing device 522 of the laser beam applying means 52. Subsequently, a focal point P of a pulsed laser beam radiated through the focusing device 522 is positioned to an intermediate part in the thickness direction of the semiconductor wafer 2. Then, while applying a pulsed laser beam with such a wavelength as to be transmitted through the silicon wafer from the focusing device 522 to the silicon wafer, the chuck table 51 is moved at a predetermined feeding speed in the direction indicated by arrow X1 in FIG. 5A. When the application position of the focusing device 522 of the laser beam applying means 52 arrives at the other end of the division line 21 as shown in FIG. 5B, the application (radiation) of the pulsed laser beam is stopped, and the movement of the chuck table 51 is stopped. As a result, a modified layer 23 is formed in the inside of the semiconductor wafer 2 along the division line 21.

Note that the processing conditions in the modified layer forming step are set, for example, as follows.

Light source: YAG pulsed laser
Wavelength: 1064 nm
Repetition frequency: 100 kHz
Average output: 0.3 W
Focused spot diameter: 1 μm
Feeding rate: 100 mm/second After the modified layer forming step is performed along the predetermined division line 21 as above, the chuck table 51 is indexingly moved by the interval of the division lines 21 formed on the semiconductor wafer 2 in the direction indicated by arrow Y (indexing step), and the modified layer forming step is carried out. After the modified layer forming step is conducted along all the division lines 21 in the first direction in this manner, the chuck table 51 is rotated 90 degrees, and the modified layer forming step is carried out along each of the division lines 21 extending in the second direction orthogonal to the division lines 21 formed in the first direction.

After the modified layer forming step is conducted, a back side grinding step is carried out in which the back side of the semiconductor wafer 2 is ground while supplying grinding water so as to form the semiconductor wafer 2 into a predetermined thickness and the semiconductor wafer 2 is cracked along the division lines 21 using the modified layers 23 as crack starting points so as to divide the semiconductor wafer 2 into the individual device chips. The back side grinding step is performed by use of a grinding apparatus 6 shown in FIG. 6A. The grinding apparatus 6 depicted in FIG. 6A includes a chuck table 61 as holding means for holding a workpiece, and grinding means 62 for grinding the workpiece held on the chuck table 61. The chuck table 61 is configured to hold the workpiece on an upper surface thereof by suction, and is rotated by a rotational driving mechanism (not shown) in the direction indicated by arrow A in FIG. 6A. The grinding means 62 includes a spindle housing 631, a rotary spindle 632 rotatably supported on the spindle housing 631 and rotated by the rotational driving mechanism (not shown), a mounter 633 attached to the lower end of the rotary spindle 632, and a grinding wheel 634 mounted to a lower surface of the mounter 633. The grinding wheel 634 includes a circular annular base 635, and grindstones 636 mounted in an annular pattern to a lower surface of the base 635. The base 635 is mounted to the lower surface of the mounter 633 by fastening bolts 637. Note that the rotary spindle 632 constituting the grinding apparatus 6 as above is provided along an axis thereof with a grinding water supply passage, through which grinding water is supplied to a grinding region where grinding by the grindstones 636 is performed.

Figure 6A:
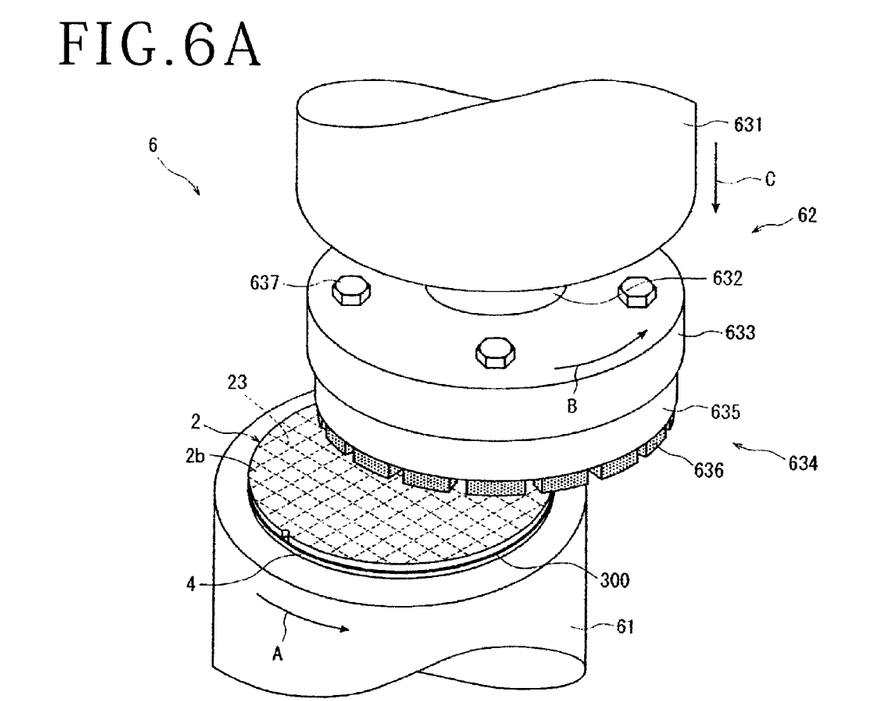
FIGS. 6A and 6B are explanatory views illustrating a back side grinding step.
Figure 6B:
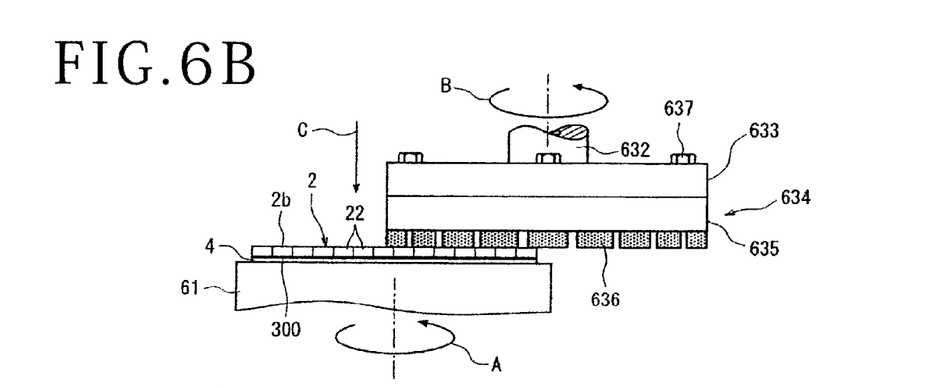

To perform the back side grinding step by use of the aforementioned grinding apparatus 6, the semiconductor wafer 2 is placed on the chuck table 61 so that the protective tape 4 adhered to its front side makes contact with the upper surface (holding surface) of the chuck table 61, as shown in FIG. 6A. Then, suction means (not shown) is operated to suction hold the semiconductor wafer 2 onto the chuck table 61 through the protective tape 4 (wafer holding step). Therefore, the semiconductor wafer 2 held on the chuck table 61 has its back side 2*b* on the upper side. With the semiconductor wafer 2 suction held on the chuck table 61 through the protective tape 4 in this manner, the chuck table 61 is kept rotated at, for example, 300 rpm in the direction of arrow A in FIG. 6A, the grinding wheel 634 of the grinding means 62 is rotated at, for example, 6,000 rpm in the direction of arrow B in FIG. 6A, the grindstones 636 are brought into contact with the back side 2*b* (work surface) of the semiconductor wafer 2 as depicted in FIG. 6B, and the grinding wheel 634 is fed downward (in the direction perpendicular to the holding surface of the chuck table 61) at a feeding rate of, for example, 1 μm/second and by a predetermined amount, as indicated by arrow C. At the time of carrying out the back side grinding step in this way, grinding water is supplied to the grinding region where grinding by the grindstones 636 is performed. As a result, the back side 2*b* of the semiconductor wafer 2 is ground to form the semiconductor wafer 2 into a predetermined thickness (for example, 100 μm), and the semiconductor wafer 2 is divided along the division lines 21, where wafer strength has been lowered due to the formation of the modified layers 23, into the individual devices (device chips) 22. Note that the plurality of the individually split devices 22 are not scattered but remain in the form of the semiconductor wafer 2, since the protective tape 4 remains adhered to the front side of the individual devices 22.

In the aforementioned back side grinding step, since the grinding water is supplied to the grinding region of the grindstones 636, the grinding water with the debris (grindings) mixed therein penetrates through gaps between the individually split devices 22. Since the protective film 300 has been formed on the front side 2*a* of the semiconductor wafer 2, however, the grinding water with the debris (grindings) mixed therein does not reach the front surfaces of the devices 22. Accordingly, the problem that the grinding water with the debris (grindings) mixed therein contaminates the devices 22 to lower the device quality can be avoided. Note that even when the semiconductor wafer 2 is divided into the individual devices 22 during grinding, the protective film 300 formed as a comparatively firm coating on the front side 2*a* of the semiconductor wafer 2 restrains the gaps between the individual devices 22 from widening. Therefore, penetration of the grinding water is inhibited, and, consequently, side surface contamination of the devices can be reduced.

Figure 7A:
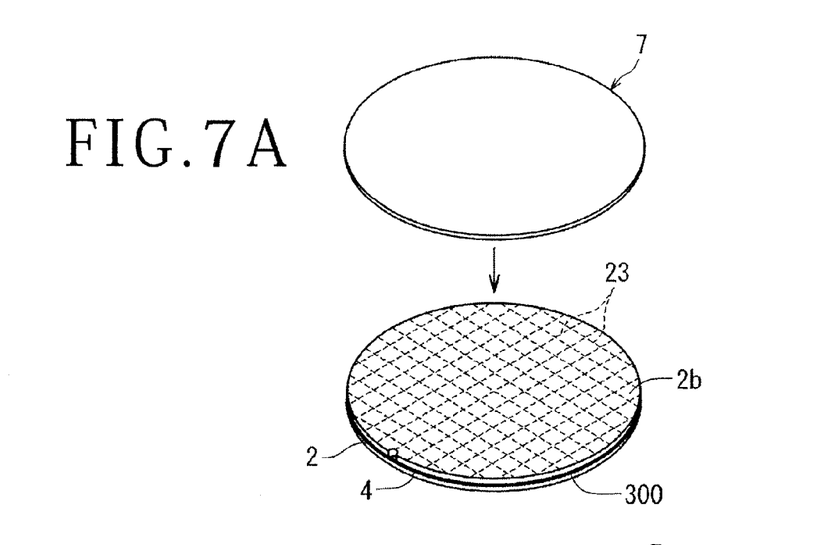
FIGS. 7A to 7C are explanatory views illustrating a first embodiment of a wafer supporting step.
Figure 7B:
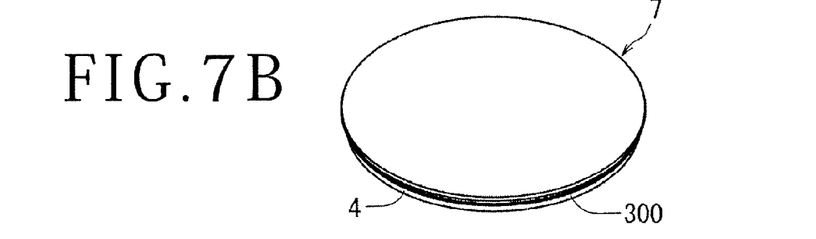
Figure 7C:
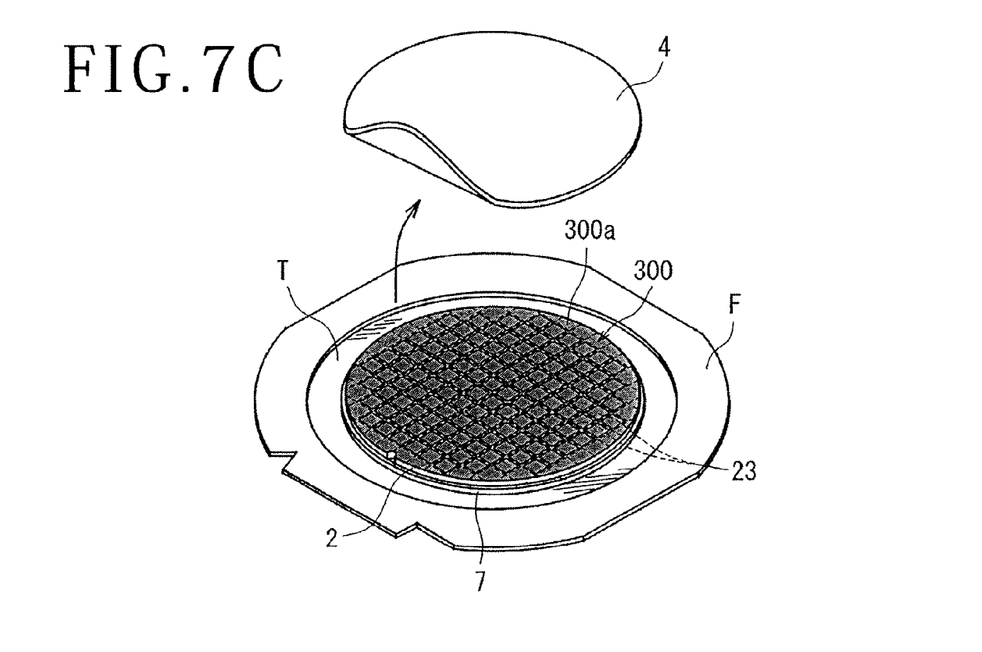

Next, a wafer supporting step is conducted in which an adhesive film is attached to the back side of the semiconductor wafer 2 having been subjected to the back side grinding step, a dicing tape is adhered to the adhesive film side, and a peripheral portion of the dicing tape is supported by an annular frame. In this embodiment of the wafer supporting step, the adhesive film 7 is attached to the back side 2*b* of the semiconductor wafer 2 as shown in FIGS. 7A and 7B (adhesive film attaching step). Note that the adhesive film 7 is formed to be slightly greater than the semiconductor wafer 2 so as to ensure its attachment to the entire area of the back side 2*b* of the semiconductor wafer 2. After the adhesive film 7 is thus attached to the back side 2*b* of the semiconductor wafer 2, the adhesive film 7 side of the semiconductor wafer 2 with the adhesive film 7 attached thereto is adhered to an expandable dicing tape T attached to an annular frame F, as shown in FIG. 7C. Then, the protective tape 4 adhered to the surface of the protective film 300 formed as a coating on the front side 2*a* of the semiconductor wafer 2 is peeled (protective tape peeling step). Note that while an example in which the adhesive film 7 side of the semiconductor wafer 2 with the adhesive film 7 attached thereto is adhered to the dicing tape T attached to the annular frame F has been shown in the embodiment illustrated in FIGS. 7A to 7C, a configuration may be adopted in which the dicing tape T is adhered to the adhesive film 7 side of the semiconductor wafer 2 with the adhesive film 7 attached thereto and, simultaneously, the peripheral portion of the dicing tape T is attached to the annular frame F.

Figure 8A:
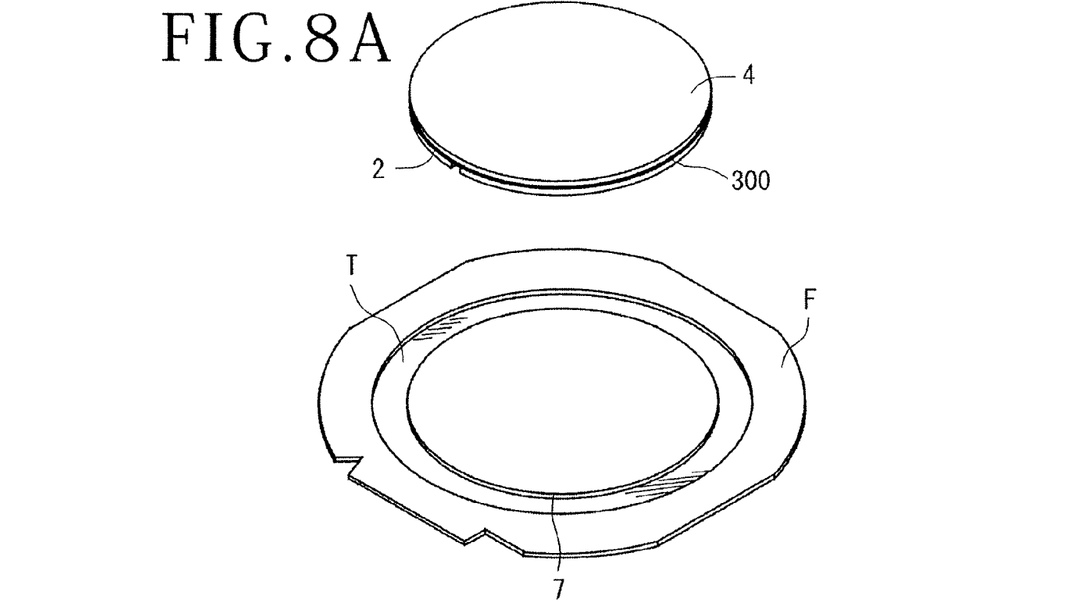
FIGS. 8A and 8B are explanatory views illustrating a second embodiment of a wafer supporting step.
Figure 8B:
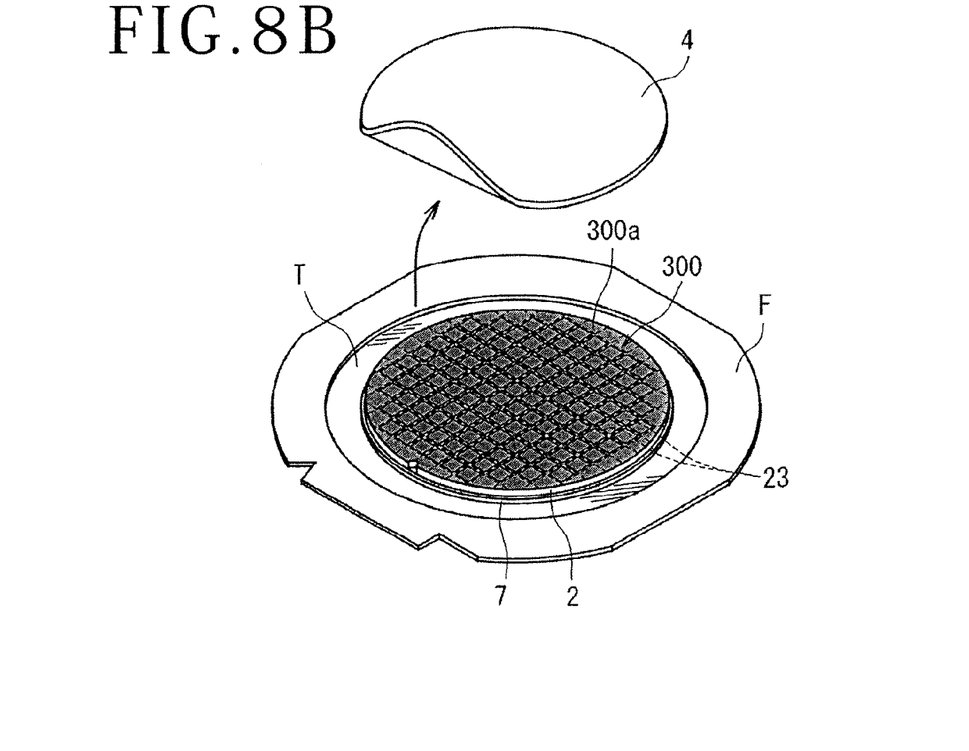

Another embodiment of the aforementioned wafer supporting step will be described, referring to FIGS. 8A and 8B. In the embodiment illustrated in FIGS. 8A and 8B, a dicing tape with adhesive film wherein an adhesive film 7 is preliminarily adhered to a surface of a dicing tape T is used. Specifically, as shown in FIGS. 8A and 8B, a back side 2*b* of a semiconductor wafer 2 is attached to the adhesive film 7 adhered to a surface of the dicing tape T having a peripheral portion so attached as to cover an inside opening portion of an annular frame F, as shown in FIGS. 8A and 8B. In the case where a dicing tape with reinforcement sheet is thus used, by attaching the back side 2*b* of the semiconductor wafer 2 to the adhesive film 7 adhered to the surface of the dicing tape T it is ensured that the semiconductor wafer 2 with the adhesive film 7 attached thereto is supported by the dicing tape T attached to the annular frame F. Note that the adhesive film 7 preliminarily adhered to the surface of the dicing tape T is also formed to be slightly greater than the semiconductor wafer 2 so as to ensure its attachment to the entire area of the back side 2*b* of the semiconductor wafer 2. Then, as shown in FIG. 8B, a protective tape 4 adhered to the surface of a protective film 300 foamed as a coating on a front side 2*a* of the semiconductor wafer 2 is peeled (protective tape peeling step). Note that an example wherein the back side 2*b* of the semiconductor wafer 2 is attached to the adhesive film 7 adhered to the surface of the dicing tape T having a peripheral portion attached to the annular frame F has been shown in this embodiment, a configuration may be adopted in which the adhesive film 7 adhered to the dicing tape T is attached to the back side 2b of the semiconductor wafer 2 and, simultaneously, the peripheral portion of the dicing tape T is attached to the annular frame F.

Figure 9:
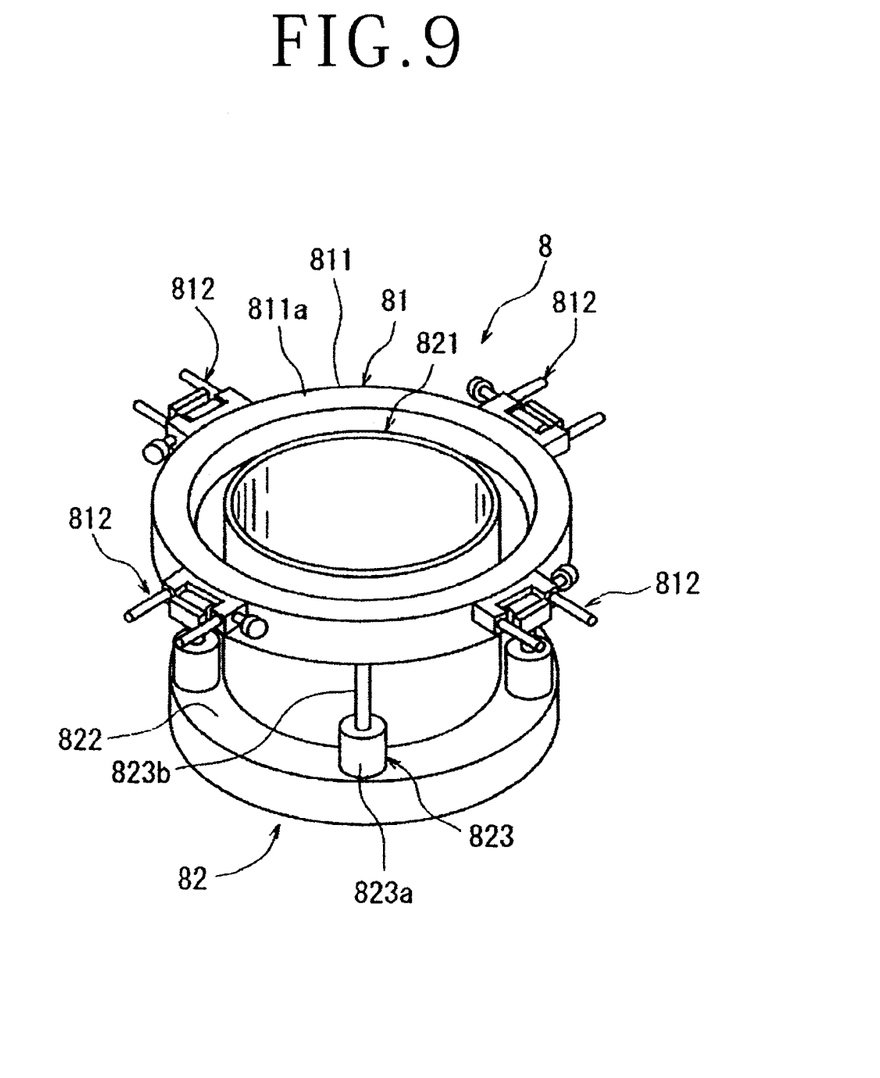
FIG. 9 is a perspective view of a tape expanding apparatus configured according to the present invention.

After the wafer supporting step is conducted as above, an adhesive film breaking step is performed in which the dicing tape T is expanded to break the adhesive film 7 along the individual devices 22. This adhesive film breaking step is carried out by use of a tape expanding apparatus 8 depicted in FIG. 9. The tape expanding apparatus 8 shown in FIG. 9 includes frame holding means 81 for holding the annular frame F, and tape expanding means 82 for expanding the dicing tape T attached to the annular frame F held by the frame holding means 81. The frame holding means 81 includes an annular frame holding member 811, and a plurality of clamps 812 as fixing means disposed at the periphery of the frame holding member 811. An upper surface of the frame holding member 811 forms a mount surface 811a on which to mount the annular frame F, and the annular frame F is mounted on the mount surface 811a. The annular frame F mounted on the mount surface 811a is fixed to the frame holding member 811 by the clamps 812. The frame holding means 81 configured in this manner is supported by a tape expanding means 82 so as to be movable (advanceable and retractable) in the vertical direction.

Figure 10A:
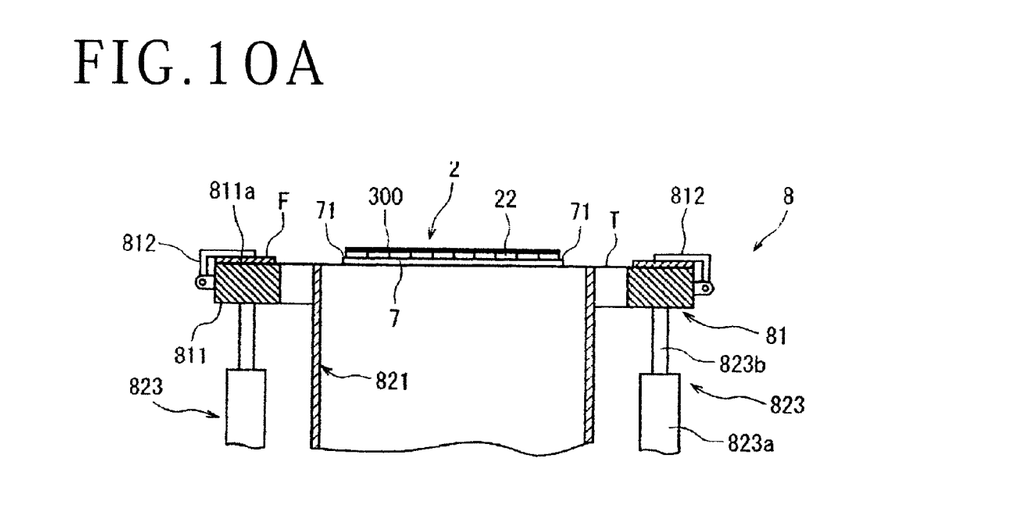
FIGS. 10A and 10B are explanatory views illustrating an adhesive film breaking step.
Figure 10B:
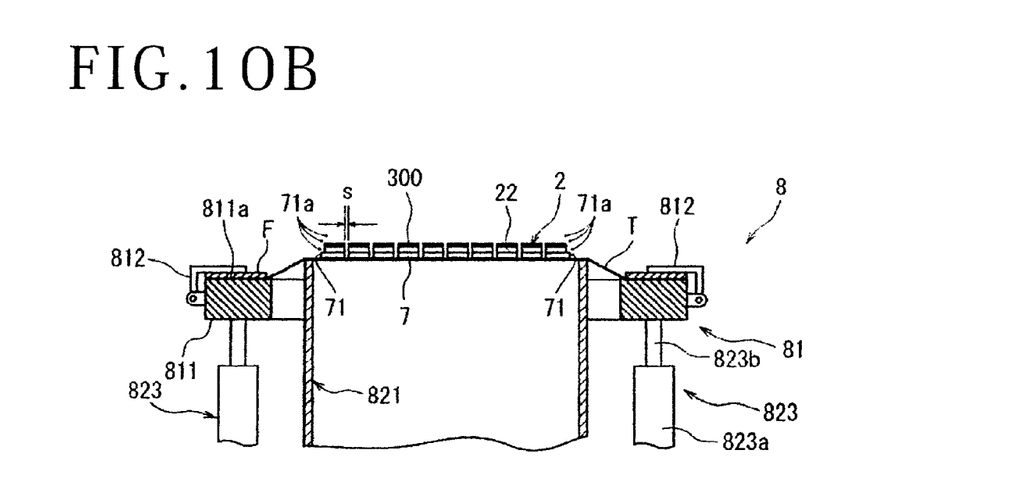

The tape expanding means 82 includes an expansion drum 821 disposed inside the annular frame holding member 811. The expansion drum 821 has an inside diameter and an outside diameter which are smaller than the inside diameter of the annular frame F and greater than the outside diameter of the semiconductor wafer 2 adhered to the dicing tape T attached to the annular frame F. In addition, the expansion drum 821 includes a support flange 822 at the lower end thereof. The tape expanding means 82 in this embodiment includes support means 823 which can move (advance and retract) the annular frame holding member 811 in the vertical direction. The support means 823 includes a plurality of air cylinders 823a disposed on the support flange 822, and piston rods 823b of the air cylinders 823a are connected to a lower surface of the annular frame holding member 811. The support means 823 thus including the plurality of air cylinders 823a moves the annular frame holding member 811 in the vertical direction between a reference position wherein the mount surface 811a is at substantially the same height as the upper end of the expansion drum 821, as shown in FIG. 10A, and an expanding position wherein the mount surface 811a is a predetermined amount below the upper end of the expansion drum 821, as shown in FIG. 10B.

The adhesive film breaking step performed by use of the tape expanding apparatus 8 configured as above will be described referring to FIGS. 10A and 10B. Specifically, the annular frame F to which the dicing tape T with the semiconductor wafer 2 adhered thereto is attached is mounted on the mount surface 811a of the frame holding member 811 as shown in FIG. 10A, and is fixed to the frame holding member 811 by the clamps 812 (frame holding step). In this instance, the frame holding member 811 is positioned in the reference position depicted in FIG. 10A. Next, the plurality of air cylinders 823a as the support means 823 constituting the tape expanding means 82 are operated to lower the annular frame holding member 811 into the expanding position depicted in FIG. 10B. Therefore, the annular frame F fixed on the mount surface 811a of the frame holding member 811 is also lowered, so that the dicing tape T attached to the annular frame F is expanded through making contact with the upper end edge of the expansion drum 821 as shown in FIG. 10B (tape expanding step).

Accordingly, in the semiconductor wafer (having been divided along the division lines 21) adhered to the dicing tape T through the adhesive film 7, gaps (s) are formed between the devices 22. As a result, the adhesive film 7 attached to the back side of the semiconductor wafer 2 is broken and separated along each of the devices 22. When the adhesive film 7 is broken along each of the devices 22 in this way, a part 71a of a peripheral portion 71 of the adhesive film 7 protruding from a peripheral edge of the semiconductor wafer 2 is fragmented and scattered, as shown in FIG. 10B, to fall onto the front side of the devices 22. Since the protective film 300 is provided as a coating on the front side of the devices 22, the part 71a of the peripheral portion 71 of the adhesive film 7 which is fragmented adheres to the surface of the protective film 300 present as a coating on the front side of the devices 22, so that the part 71a of the peripheral portion 71 of the adhesive film 7 which is fragmented would not adhere directly to the front surfaces of the devices 22. Therefore, when the protective film 300 present as a coating on the front side of the devices 22 is removed, the part 71a of the peripheral portion 71 of the adhesive film 7 adhered to the protective film 300 is also removed, so that the quality of the devices 22 is not lowered.

Figure 11A:
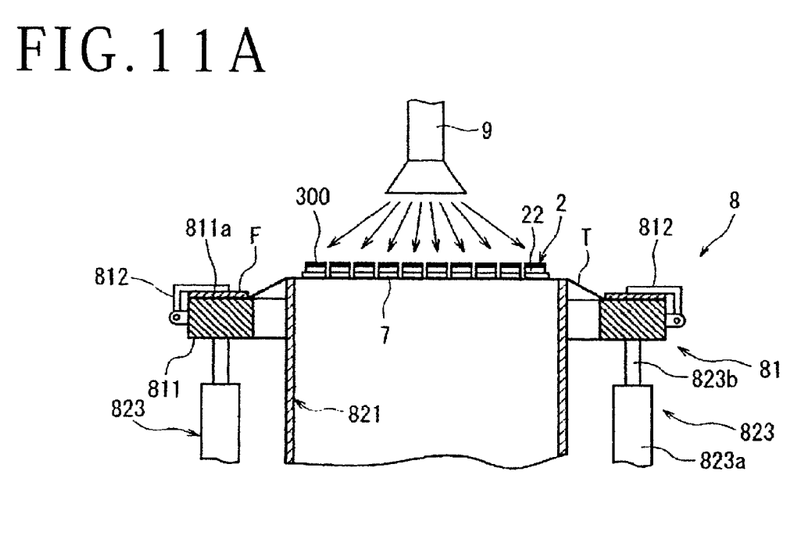
FIGS. 11A and 11B are explanatory views illustrating a protective film removing step.
Figure 11B:
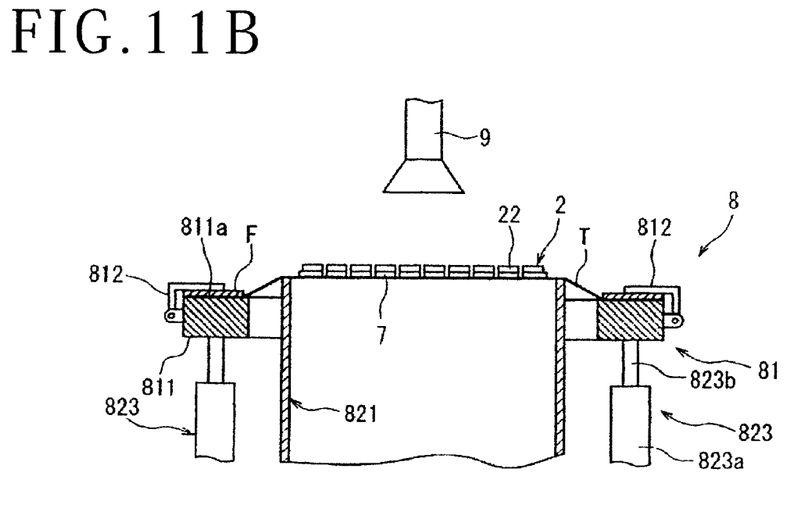

After the aforementioned adhesive film breaking step is performed, a protective film removing step is conducted in which a cleaning liquid is supplied to the front surfaces of the individual devices (device chips) 22 so as to remove the protective film 300. In the protective film removing step, starting from the condition shown in FIG. 10B where the adhesive film breaking step has been conducted, the tape expanding apparatus 8 is positioned into a position directly under a cleaning water supply nozzle 9 of the tape expanding apparatus 8 as shown in FIG. 11A, and cleaning water as a cleaning liquid is supplied from the cleaning water supply nozzle 9 to the surface of the protective film 300 present as a coating on the front surfaces of the individual devices 22 adhered to the dicing tape T attached to the annular frame F. As a result, the protective film 300, which is formed of a water-soluble resin, is easily removed by the cleaning water, and the part of the adhesive film 7 adhered to the surface of the protective film 300 is also removed, as shown in FIG. 11B. Therefore, the part of the adhesive film does not adhere to the front surfaces of the devices 22, so that the quality of the devices 22 is not lowered.

After the protective film removing step is conducted as above, a picking-up step is carried out in which the devices 22 with the adhesive film 7 attached to the back surfaces thereof are peeled from the dicing tape T and are picked up.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for dividing a wafer having a plurality of division lines in a grid pattern on a front side thereof and having a device in each of a plurality of regions partitioned by the division lines, along the division lines into individual device chips, the wafer processing method comprising:

a protective film forming step of applying a liquid resin to the front side of the wafer to form a protective film followed by;

a protective tape adhering step of adhering a protective tape to a surface of the protective film;

a modified layer forming step of applying a laser beam having such a wavelength as to be transmitted through the wafer to the wafer along each of the division lines, with a focal point positioned inside the wafer, to form a modified layer inside the wafer along each of the division lines; and a back side grinding step of grinding a back side of the wafer while supplying grinding water to thin the wafer to a predetermined thickness and to crack the wafer along the division lines using the modified layers as crack starting points so as to divide the wafer into individual device chips, after the protective film forming step, the protective tape adhering step, and the modified layer forming step are carried out.

2. The wafer processing method according to claim 1, further comprising:

a wafer supporting step of adhering an adhesive film to the back side of the wafer divided into the individual device chips and adhering to the adhesive film a dicing tape having a peripheral portion attached to an annular frame so as to support the wafer with the annular frame, after the back side grinding step is carried out;

an adhesive film breaking step of expanding the dicing tape to break the adhesive film along the individual deice chips, after the wafer supporting step is carried out; and a protective film removing step of supplying a cleaning liquid to a front side of the individual device chips to remove the protective film, after the adhesive film breaking step is carried out.

3. The wafer processing method according to claim 2, wherein the liquid resin includes a water-soluble resin, and the cleaning liquid is cleaning water.

* * * * *

UNITED STATES PATENT AND TRADEMARK OFFICE
CERTIFICATE OF CORRECTION

| | |
|---|---|
| PATENT NO. | : 9,627,242 B2 |
| APPLICATION NO. | : 14/727214 |
| DATED | : April 18, 2017 |
| INVENTOR(S) | : Masaru Nakamura |

It is certified that error appears in the above-identified patent and that said Letters Patent is hereby corrected as shown below:

In the Claims

Column 11, Line 23, delete "deice" and insert --device-- therefor.

Signed and Sealed this
Third Day of October, 2017

Joseph Matal
*Performing the Functions and Duties of the*
*Under Secretary of Commerce for Intellectual Property and*
*Director of the United States Patent and Trademark Office*